(12) United States Patent
Ramchandran et al.

(10) Patent No.: US 6,418,549 B1
(45) Date of Patent: Jul. 9, 2002

(54) DATA TRANSMISSION USING ARITHMETIC CODING BASED CONTINUOUS ERROR DETECTION

(75) Inventors: Kannan Ramchandran, Champaign, IL (US); Jim Chou, Redondo Beach, CA (US); Igor Kozintsev, Savoy, IL (US)

(73) Assignee: Merunetworks, Inc., Santa Clara, CA (US)

( * ) Notice: Subject to any disclaimer, the term of this patent is extended or adjusted under 35 U.S.C. 154(b) by 0 days.

(21) Appl. No.: 09/351,631

(22) Filed: Jul. 12, 1999

Related U.S. Application Data (60) Provisional application No. 60/106,348, filed on Oct. 30, 1998.

(51) Int. Cl.[7] .................. G06F 11/00; H03M 13/00; H04L 1/18
(52) U.S. Cl. ........................ 714/811; 714/748
(58) Field of Search .................. 714/752, 755, 714/786, 811, 748

(56) References Cited

U.S. PATENT DOCUMENTS

| | | | |
|---|---|---|---|
| 3,927,251 A | 12/1975 | White et al. | 358/261.3 |
| 4,149,142 A | 4/1979 | Kageyama et al. | 714/785 |
| 4,276,646 A | 6/1981 | Haggard et al. | 714/785 |
| 4,718,066 A | 1/1988 | Rogard | 714/751 |
| 4,792,954 A | 12/1988 | Arps et al. | 714/799 |

(List continued on next page.)

OTHER PUBLICATIONS

G. Langdon, "An Introduction to Arithmetic Coding", *IBM J. Res. Develop.*, vol. 28, pp. 135–149, 3/84.

(List continued on next page.)

*Primary Examiner*—Albert Decady
*Assistant Examiner*—Shelly A Chase
(74) *Attorney, Agent, or Firm*—Hamilton Brook Smith & Reynolds, P.C.

(57) ABSTRACT

Method and apparatus for image transmission using arithmetic coding, based on continuous error detection uses a controlled amount of added redundancy. A continuous error detection scheme is provided, wherein there is a trade-off between the amount of added redundancy and the time needed to detect an error once it occurs. Herein, there is no need for the cyclic redundancy check (CRC) to wait until an entire block of data has been received and processed before an error can be detected. The invention can be used to great advantage both in the automatic repeat request (ARQ) and other concatenated coding schemes. Errors in the received bit stream are detected by introducing added redundancy, e.g., a forbidden symbol, in the arithmetic coding operation. The forbidden symbol is never intended to be encoded. The redundancy error causes loss of synchronization, which is used to detect errors. If a forbidden symbol gets decoded, it means that an error has occurred. In this invention, there is direct control over the amount of redundancy added vs. the amount of time it takes to detect an error. For image compression systems, by using the invention and ARQ, only one device would suffice both for source compression and channel coding.

8 Claims, 9 Drawing Sheets

U.S. PATENT DOCUMENTS

| | | | | |
|---|---|---|---|---|
| 4,796,260 A | | 1/1989 | Schilling et al. | 714/755 |
| 4,829,526 A | | 5/1989 | Clark et al. | 714/762 |
| 4,849,976 A | | 7/1989 | Schilling et al. | 714/755 |
| 5,265,164 A | | 11/1993 | Matyas et al. | 380/30 |
| 5,321,704 A | | 6/1994 | Erickson et al. | 714/781 |
| 5,321,705 A | | 6/1994 | Gould et al. | 714/795 |
| 5,457,704 A | * | 10/1995 | Hoeher et al. | 714/794 |
| 5,487,068 A | | 1/1996 | Smolinske et al. | 370/450 |
| 5,497,383 A | | 3/1996 | Thome et al. | 714/795 |
| 5,530,708 A | | 6/1996 | Miya | 714/795 |
| 5,537,444 A | * | 7/1996 | Nill et al. | 375/341 |
| 5,629,948 A | | 5/1997 | Hagiwara et al. | 714/748 |
| 5,638,384 A | | 6/1997 | Hayashi et al. | 714/752 |
| 5,671,156 A | | 9/1997 | Weerackody et al. | 714/52 |
| 5,680,322 A | | 10/1997 | Shinoda | 714/18 |
| 5,715,257 A | | 2/1998 | Matsuki et al. | 714/748 |
| 5,719,883 A | | 2/1998 | Ayanoglu | 714/781 |
| 5,737,645 A | | 4/1998 | Pelz et al. | 714/786 |
| 5,742,622 A | | 4/1998 | Claydon et al. | 714/789 |
| 5,745,502 A | | 4/1998 | Khayrallah et al. | 714/781 |
| 5,778,191 A | | 7/1998 | Levine et al. | 709/247 |

OTHER PUBLICATIONS

C. Boyd, et al., "Integrating Error Detection into Arithmetic Coding", *IEEE Trans. Commun.*, vol. 4, pp. 1–3, 1/97.

A. Said and W. Pearlman, "Image Compression using the Spatial–Orientation Tree", *Int. Symp. Circuits & Systems*, vol. I, (Chicago), pp. 279–82, 5/93.

A. Viterbi, "Error Bounds for Convolutional Codes and and Asymptotically Optimal Decoding Algorithm", *IEEE Trans. on Inform. Theory*, vol. IT–13, pp. 260–69, 1967.

N. Seshadri and C. Sundberg, "List Viterbi Decoding Algorithms with Applications", *IEEE Trans. on Commun.*, vol. 42, pp. 313–23, 1994.

J. Hagenauer, "Rate Compatible Punctured Convolutional Codes (RCPC–Codes) and Their Applications", *IEEE Trans. Commun.*, vol. 36, pp. 389–400, 4/88.

S. LoPresto, et al., "Image Coding Based on Mixture Modeling of Wavelet Coefficients and a Fast Estimation–Quantization Framework", *Proc. IEEE Data Compression Conf.*, pp. 221–30, 1997.

P.G. Sherwood and K. Zeger, "Progressive Image Coding on Noisy Channels", *Proc. IEEE Data Compression Conf.*, Snowbird, UT, 1997.

Kozintsev, I., et al., "Image Transmission Using Arithmetic Coding Based Continuous Error Detection," *Proc. of Data Compression Conference*, DCC–98, Snowbird, Utah, (Mar. 1998).

Chou, J. and Ramchandran, K., "Arithmetic Coding Based Continuous Error Detection for Efficient ARQ–based Image Transmission," Proc 31st Annual Asilomar Conference on Signals, Systems, and Computers, Pacific Grove, CA (Nov. 1997).

* cited by examiner

| ALGORITHM | COMPRESSION BIT-RATE | | |
|---|---|---|---|
| | .25 bpp | .50 bpp | 1.00 bpp |
| NEW ARQ | 32.85 dB | 36.08 dB | 39.23 dB |
| CONVENTIONAL ARQ | 31.71 dB | 34.93 dB | 38.07 dB |

DATA TRANSMISSION USING ARITHMETIC CODING BASED CONTINUOUS ERROR DETECTION

RELATED APPLICATIONS

This application claims the benefit of priority from U.S. Provisional Application No. 60/106,348, filed on Oct. 30, 1998, the entire teachings of which are incorporated herein by reference.

BACKGROUND AND FIELD OF THE INVENTION

This invention relates to data transmission using continuous error detection based on arithmetic coding.

Arithmetic coding, as used in this invention, differs considerably from other compression techniques such as prefix (Huffman) block codes. Arithmetic coding is also distinct from error control coding, which can be used to detect and rectify errors in computer operations. Arithmetic coding, generally, is a data compression technique, which sequentially encodes data or a data string by creating a code string which represents a fractional value on the number line between 0 and 1. The coding algorithm performs encoding/decoding by operations upon one data symbol per iteration. The algorithm deals with successively smaller intervals, and the code string lies in each of the nested intervals. The code-string length corresponding to the data string is equivalent to the number of bits necessary to represent the magnitude of the interval in which the code-string falls. The data string of information is recovered by using magnitude comparisons on the code-string to recreate how the encoder must have successively partitioned and retained each nested subinterval.

The use of block cyclic redundancy check (CRC) is known as a popular and powerful error detection technique in modem digital communications.

However, though efficient, CRCs can detect errors only after an entire block of data has been received and processed. This invention provides a new class of "continuous" error detection techniques, and shows its applicability in a variety of popular communication applications, including (a) data transmission based on Automatic Repeat Request (ARQ), and (b) (Serially) Concatenated Coding systems deploying an inner error-correction code and an outer error-detection code. The inventive approach is based on a popular source (entropy) coding technique, namely the arithmetic coder. The basic concept of continuous error detection based on arithmetic coding was first suggested by Boyd, et al. in a paper entitled "Integrating Error Detection into Arithmetic Coding" by C. Boyd, J. Cleary, S. Irvine, I. Rinsma-Melchert, and I. Witten, in IEEE Transactions on Communications, vol. 45, no. 1, Jan. 1997, albeit with little system performance analysis or exposition of its utility in communication systems. This invention presents a more rigorous analysis of this paradigm, quantifying the underlying tradeoffs involved in the process, but also establishes the impressive gains in system performance that are attainable through sophisticated integration of this novel paradigm into popular, powerful transmission applications such as those listed above.

There are several US patents which generally and severally relate to data coding, ARQ, and CRC in data transmission applications.

U.S. Pat. No. 5,530,708 to Miya teaches an error detection in data wherein the data is attached with error detection codes and then subjected to convolutional coding. The input data in Miya is subsequently subjected to an error correction Viterbi decoding operation, whereby at the time of detecting an error in the error detection code, an error detection block which has an error present therein is also detected.

U.S. Pat. No. 4,149,142 to Kageyama et al. teaches a selective automatic Request repeat (ARQ) system for controlling errors occurring in transmission of data on telephone data communication channels. Therein, an error controlling signal is devoid of a check bit for detection or correction of errors, thus obviating time loss which would occur if an error control signal was repeatedly issued between the transmission and receiving sides. The Kageyama system is useful in static image transmission.

In U.S. Pat. No. 5,715,257 to Matsuki et al., a selective repeat ARQ system with limited buffer memory is obtained by modifying a part of a user data area in a data frame. A comparison is made between a modified and an unmodified version of the user data area from the same frame number, and said part of the user data is preferably the last word area in a user data area in a frame structure.

U.S. Pat. No. 4,276,646 to Haggard et al. teaches method an apparatus for detecting errors in a data set of sequential binary digits. Initially, alternating ones of the binary digits are separated into data subsets to generate a CRC for each data subset. The code subsets are merged into a codeset. Depending on the form of the CRC generator, the code subset CRC value will indicate the presence of an error and the error location.

U.S. Pat. No. 4,718,066 to Rogard is directed to data transmission between a satellite and land mobile terminals. The system encodes data in sets of blocks including redundant symbols and redundant blocks, and provides automatic retransmission of lost data blocks, and in parallel, correction of detected errors within received blocks.

IEEE publication, "Integrating Error Detection into Arithmetic Coding" by C. Boyd, J. G. Cleary, S. A. Irvine, I. Rinsma-Melchert, and I. H. Witten in *IEEE Transactions on Communication,* vol. 45, no. 1, Jan. 1997, teaches integrating error detection into arithmetic coding. In the publication, there is a discussion of why arithmetic coding can be used for error control. The publication states that with arithmetic coding, (a) the amount of redundancy included in the encoded message can be controlled as a single tunable parameter of the coding processing, and (b) error checking can take place continuously as each input bit is processed so that errors are located quickly. As per the IEEE publication, redundancy is introduced by adjusting the coding space so that some parts are never used by the encoder. During decoding, if the number defined by the received encoded string ever enters the forbidden region, a communication error must have occurred. To adjust the coding space, at regular points in the encoding procedure, the current coding interval is reduced by a certain proportion, which is called the "reduction factor". Upon decoding, the same reduction process is performed. The number defined by the received string is checked after each reduction to see if it lies within the received interval. If not, an error has occurred. Redundancy is controlled by varying the "reduction factor". Another method of adding redundancy is to use an extra model with only two symbols, encoding one of them periodically, and signaling an error if the other is ever decoded. The publication also discusses choosing the reduction factor, guaranteeing detection of single bit errors, and the use of end of file markers.

SUMMARY OF THE INVENTION

An object of this invention generally, is to provide continuous error checking in the transmission of data from a transmitter to a receiver, wherein, there is no need to wait for error checking until a complete block of data is transmitted.

In one aspect, the invention resides in a method of data-transmission from a transmitter to a receiver using an arithmetic coder without using cyclic redundancy check codes, comprising adding a forbidden symbol, which occupies $\epsilon$-th portion of a coding space to a data stream of said data to increase redundancy, said forbidden symbol not being meant to be coded, controlling said coding space as necessary to control the redundancy, tracking if said forbidden symbol is decoded at the receiver and using a presence of such forbidden symbol decoding for error detection in said data transmission, conveying a position of an error to the transmitter, and requesting a retransmission of n bits where n is related to a confidence level whereby continuous error detection in said data transmission is performed with automatic repeat request.

In another aspect, the invention provides a method of transmitting data with continuous error detection in a received data bitstream, using a serially concatenated coding scheme with an inner convolutional coder and outer error detection coder by employing Viterbi Algorithms (VA), comprising changing the VA to produce an ordered list of N most likely transmitted codewords for a list N VA, checking a list of N best survivor paths during transmission, and using continuous error detection code to eliminate invalid trellis paths whereby a number of survivor paths needed to be processed and stored in the list N VA is reduced as compared with a number of paths needed with block cyclic redundancy check, and, continuous error detection is still ensured.

In yet another aspect, the invention provides a method of transmitting data from a transmitter to a receiver using an automatic repeat request (ARQ) to obtain continuous error detection comprising the steps of: partitioning the data into packets and introducing into the partitioned data a forbidden symbol which is not intended to be normally transmitted, nor decoded at the receiver receiving the transmitted data and checking if a decoded version of the forbidden symbol exists, indicating a transmission error, deciding in which data packet said transmission error occurred, and initiating retransmission of a portion of the data packet where said error occurred, said portion being located after occurrence of the error whereby data transmission is made more efficient.

The invention also provides a system and apparatus for data transmission using arithmetic coding generally using methods as stated supra. The continuous error detection system of the present invention allows to prune some incorrect paths earlier than the end of the block, and thus, increase the probability that the correct path will survive.

Applicants have discovered that there is a controllable trade-off between the error detection capabilities and the amount of redundancy added. The amount of time it takes to decode the "forbidden" symbol after the occurrence of an error is inversely related to the amount of redundancy added through the introduction of the forbidden symbol. The forbidden symbol is never encoded by the arithmetic coder, but occupies a non-zero measure on the set of 0-1.

The proposed framework in this invention allows for an efficient way to detect errors continuously in the received bitstream, by investing a controlled amount of redundancy in the arithmetic coding operation. Interestingly, a growing popular opinion hitherto in the image transmission over noisy channels has been to avoid using the arithmetic coder due to its well-known error-sensitivity. This invention shows that it is not only possible to overcome this drawback, but to actually exploit it to improve system performance. Further, as most state-of-the-art image coding algorithms have an arithmetic coding "last stage" for entropy coding, it becomes possible to physically integrate the source coding and channel coding tasks in the same device, namely, the arithmetic coder. In this invention, the basic idea consists in adding, to the list of data symbols to be arithmetically encoded, an extra "forbidden" symbol that is never actually transmitted, but for which a controlled amount of probability space or coding space is reserved nonetheless (note that this increases the redundancy of the coded symbol stream). By increasing the amount of coding space that the forbidden symbol occupies, it is possible make statistical guarantees about where the errors may have occurred. That is, it is possible to isolate the location of the error in a statistical sense, to any desired confidence level, to the previous n bits (where n depends on the amount of invested excess redundancy and the desired confidence level).

The invention is clearly useful in communication scenarios like ARQ or concatenated coding systems having an error-detection "outer" component. In an ARQ system, the utility comes from the ability to make statistical statements relating the time of error occurrence to the time of its detection, resulting in potential savings in the number of bits that need to be retransmitted when an error is detected. The invention teaches how to optimize the tradeoff between added redundancy and error-detection time to attain significant throughput gains. In a serially concatenated coding system using inner convolutional codes, the use of continuous error detection can likewise be useful to eliminate invalid trellis paths, leading to potential performance gains. The invention teaches how to exploit the continuous ability to dynamically prune inadmissible subpaths in a "list" Viterbi Algorithm, thereby increasing the likelihood of retaining the correct path in the final list. The approach herein significantly reduces the number of paths which have to be processed and stored in the list Viterbi Algorithm compared to the number of paths needed with block CRC detection for the same overall performance. Described hereinafter are a method and a system to achieve the gains for both ARQ and concatenated coding schemes, using both analytical methods and validating simulations that demonstrate the effectiveness of incorporating continuous error detection in the aforementioned applications.

BRIEF DESCRIPTION OF THE DRAWINGS

The foregoing and other objects, features and advantages of the invention will be apparent from the following more particular description of preferred embodiments of the invention, as illustrated in the accompanying drawings wherein, emphasis is placed upon illustrating the principles of the invention. A more detailed understanding of the invention may be had from the following description, given by way of example and to be understood in conjunction with the accompanying drawing, wherein:

FIG. 2B illustrates the peak signal to noise ratio (PSNR) values achieved by the inventive ARQ method and the conventional ARQ method when combined with the coder of the type used in the paper by A. Said and W. Perlman, "Image Compression using the Spatial-Orientation Tree", in *IEEE International Symposium on Circuits and Systems,*

Chicago; Department of Electrical, Computer, and Systems Engineering, Rensselaer Polytechnic Institute, Troy, N.Y.; pp. 279–282, May 1993;

DETAILED DESCRIPTION OF THE EMBODIMENTS

Use of Arithmetic Coder for Error Control: Continuous Error Detection

An error in an arithmetically coded stream causes a loss of synchronization, causing all resulting symbols that are decoded to become useless. It is this loss of synchronization that the invention chooses to exploit to give error detection capabilities. Encoding and decoding via the arithmetic coder are done by repetitively partitioning subintervals within the unit interval 0,1 according to the probabilities of the data symbols. The method of the invention introduces a forbidden symbol that is never intended to be encoded by the arithmetic coder, but nonetheless is assigned a nonzero probability; then by decoding, if an error occurs, this forbidden symbol is almost surely likely to be eventually decoded. This invention uses the fact that if the forbidden symbol is decoded, this guarantees that an error has surely occurred. The amount of time needed to decode the forbidden symbol after the occurrence of an error is inversely related to the amount of redundancy added through introducing the forbidden symbol.

Figure 1:
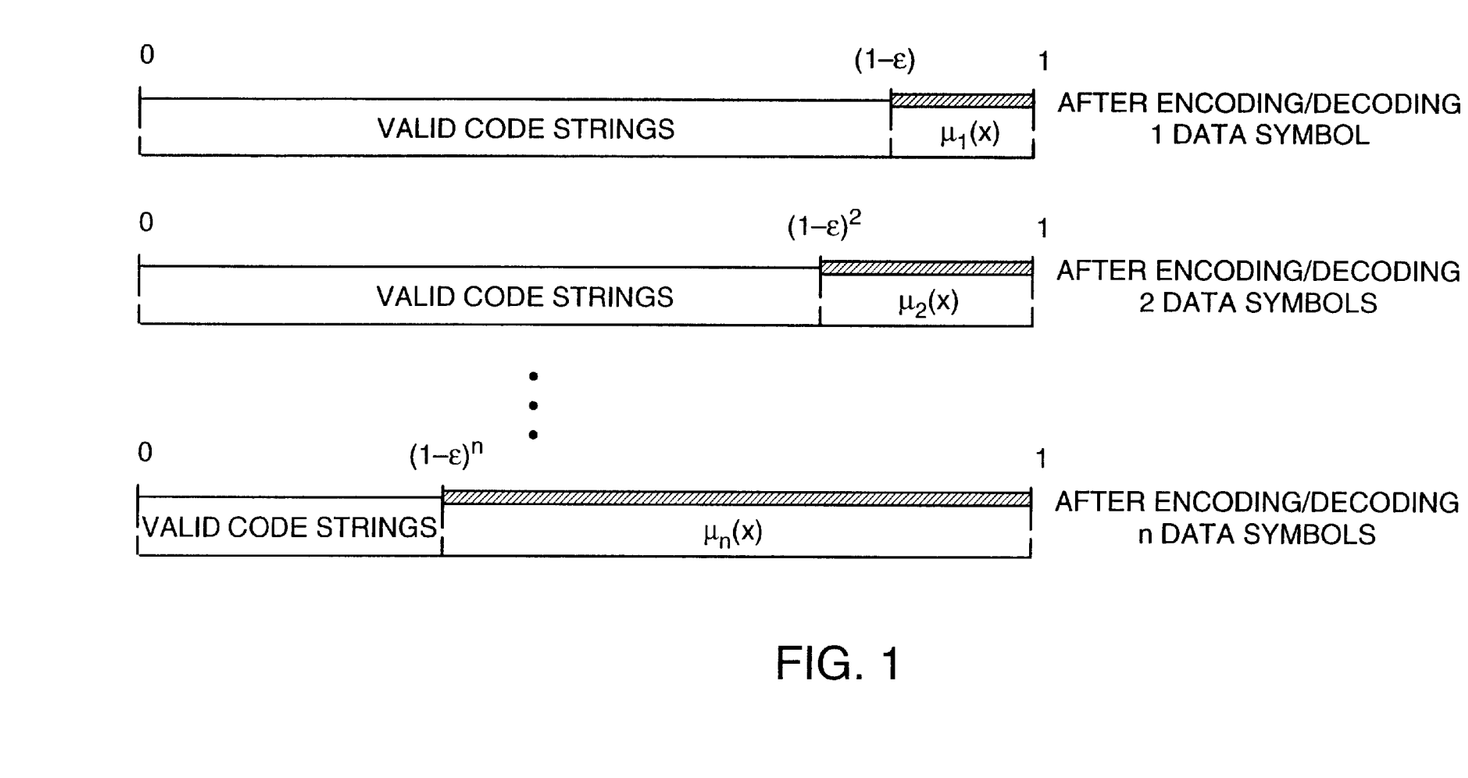
FIG. 1 shows valid code strings in the unit interval 0,1 after encoding/decoding 1 data symbol, 2 data symbols, and so forth, up to n data symbols.

With particular reference to FIG. 1, consider the case where there are only two symbols, a "good" symbol a, and the forbidden symbol x. Suppose that x is assigned probability $\epsilon(0<\epsilon<1)$ and a is assigned probability $(1-\epsilon)$. Each time a data symbol a is encoded, the subinterval corresponding to a, (with current width $\alpha$) will be partitioned as follows: (i) $(1-\epsilon)$ $\alpha$ of the subinterval is allocated to a, and (ii) $\epsilon\alpha$ of the subinterval is allocated to x. Because the forbidden symbol is never encoded, the subintervals corresponding to x are never partitioned. Then, after encoding n symbols, the length of the interval containing valid codewords is decreased by the factor $(1-68)^n$. If an error is introduced in the encoded stream, the decoded codeword will change its position on the interval 0-1. This position is well modeled as being uniformly distributed on the interval 0-1. Then, if a random variable Y is defined, which represents the number of encoded bits it takes after an error occurs to detect the error, then Y can be modeled to have a geometric distribution:

$$P_y(k)=(1-\epsilon)^{k-1}\epsilon k=1,2,\ldots,\infty \quad (1)$$

where $P_y$ represents the probability distribution of Y. This is a reasonable assumption because when an error occurs, the bitstream is no longer confined to fall in the subintervals that belong to the data symbols; the bitstream will now approximately have $\epsilon$ probability of falling in the subinterval corresponding to x (i.e., decoding the symbol x), and $1-\epsilon$ probability of falling in the subinterval corresponding to $\alpha$ for each symbol decoded. Simulations using various sizes of $\epsilon$ confirm that the geometric distribution, including said subinterval, is a valid model. From this, it is seen that:

$$P[Y>n]=(1-\epsilon)^n \quad (2)$$

Letting $\delta=P[Y>n]$, taking the logarithm of both sides of (2) and solving for n, results in $$n = \frac{\log_2(\delta)}{\log_2(1-\epsilon)} \quad (3)$$

Thus, upon detection of an error, the probability that the error occurred in the previous n bits is $(1-\delta)$. This probability can be made as small as desired. $(1-\delta)$ corresponds to a confidence level.

Amount of Redundancy Added by Introducing the Forbidden Symbol

To calculate the coding inefficiency resulting from introducing a forbidden symbol, it is noted that typically, $-\log_2(\gamma)$ bits are needed to represent a subinterval of width $\gamma$ on the unit interval $(0,1)$. By introducing a forbidden symbol 'x' that occupies a subinterval of width $\epsilon$, the rest of the data symbols will be confined to a subinterval of width $1-\epsilon$. As a result, the amount of redundancy $R_x$ due to adding the forbidden symbol x is $$R_x=-\log_2(1-\epsilon) \text{ bits/symbol encoded} \quad (4)$$

From (4) and (3) we get, $$n=-\log_2(\delta)/R_x \quad (5)$$

Also, it is seen that the amount of redundancy added for a given "confidence level" captured by $\delta$ is inversely related to the amount of time it takes to detect an error. This is useful for ARQ where, depending upon channel conditions, there are conditions in which fast detection is more important than the amount of redundancy added (noisy channel conditions) and there are conditions in which the opposite is true (calm channel conditions). From (5), is it established that there is direct control over the amount of redundancy added versus the amount of time it takes to detect an error.

ARQ with Continuous Error Detection

In conventional ARQ schemes, a 16-bit CRC is used to detect errors in packets of data. Though effective, CRCs can only detect errors in blocks of data after the entire block is received. Furthermore, CRCs provide no information as to where in the block the errors may have occurred. With the present inventive method of error detection, errors are detected a "short time" after they occur, so that bits which are not suspected to be in error do not have to be retransmitted.

To incorporate the new error detection scheme into ARQ, the arrangement generally remains the same as in ordinary ARQ except for a few minor differences. The first and most critical difference is that error detection is done continuously; as soon as the forbidden symbol is decoded at the receiver, a retransmission of n bits is requested, where n corresponds to a confidence level of $(1-\delta)$ as in (3). Since the position of the error has to be conveyed to the transmitter, an overhead of $R_n$ bits is sent over a feedback channel upon each retransmission where $R_n$ is Number of bits in feedback channel after retransmission=$R_n$=
log$_2$($N$)+32 bits        (6)

where N is the packet size and the 32 bits of overhead provide for sequencing information, flags, etc. In the present inventive scheme, packetization is needed only for the purpose of implementation, to provide starting points for the bit counter. Packet size N is significant only in contributing to the amount of overhead (log$_2$ (N) bits+other overhead) needed for each packet and may be chosen independently of the channel condition. In conventional ARQ, in contrast, N depends critically on the bit error probability of the channel (assuming a Binary Symmetric Channel—BSC) and has to be optimized. In the inventive scheme, however, the probability of a forbidden symbol, i.e., $\epsilon$, has to be matched to the channel condition.

Throughput Analysis

For simplicity, in the following analysis, a noiseless return channel and infinite receiver buffer are assumed. The probability of undetected error and the probability that the error is not corrected after the first retransmission are disregarded. Throughput is defined as the average amount of information (in bits) transmitted per channel bit. To find the throughput, we first find the average number of bits that are successfully received for each channel bit transmitted and call that $T_c$. Then, find the amount of data contained within each bit after adding parity, and call that $\beta$. The throughput T is defined as:

$$T = \beta T_c \quad (7)$$

Let Y be the random variable representing the time (in bits) from when an error occurs to when an error is detected, and let Z be the random variable representing the time (in bits) from when a retransmission (or start of transmission) is requested to when an error occurs. Then the probability distribution of Y, $P_y(k)$, is defined in (1) and the probability distribution of Z, $P_z(k)$, will be geometric with parameter $p_b$ (bit error probability of the BSC):

$$P_z(k) = (1-p_b)^k p_b \quad (8)$$

Now, define X=Y+Z to represent the number of channel bits (not including $R_n$) received in between the requests for two successive retransmissions. Because the n bits prior to the bit that produced the forbidden symbol need to be retransmitted, the number of bits that are successfully received will then be $(X-n)_+$ where $X_+$ represents the positive part of X. Then, $T_c$ can be written as $$T_c = \frac{E[(X-n)_+]}{E[X+R_n]}$$

and can be solved to be equal to $$T_c = \frac{p_b^2(1-\epsilon)^{n+1} - \epsilon^2(1-p_b)^{n+1}}{p_b^2 - \epsilon^2 + R_n \in p_b(p_b - \epsilon)(1-p_b)} \quad (9)$$

From (4), it is known that $[-\log_2(1-\epsilon)]$ bits of redundancy are added for each symbol encoded. It is also known that by passing the data through the arithmetic coder (without the forbidden symbol), one will arrive at approximately H($p_s$) bits for each data symbol encoded, where H($p_s$) represents the entropy of the source (with source probabilities $p_s$). Therefore, for every H($p_s$) information bits, H($p_s$)−log$_2$(1−$\epsilon$) bits will be needed to represent the information. The value for $\beta$ can be then written as:

$$\text{data contained in each bit after adding parity} = \beta = \frac{H(p_s)}{H(p_s) - \log_2(1-\epsilon)} \quad (10)$$

where H($p_s$) represents the entropy of the source. Combining (9) and (10), the final equation for the throughput can be obtained using (7).

Simulations confirm that the throughput equation (7) models the actual throughput very well, as will be seen in the next section.

Results for ARQ with Continuous Error Detection

Figure 2A:
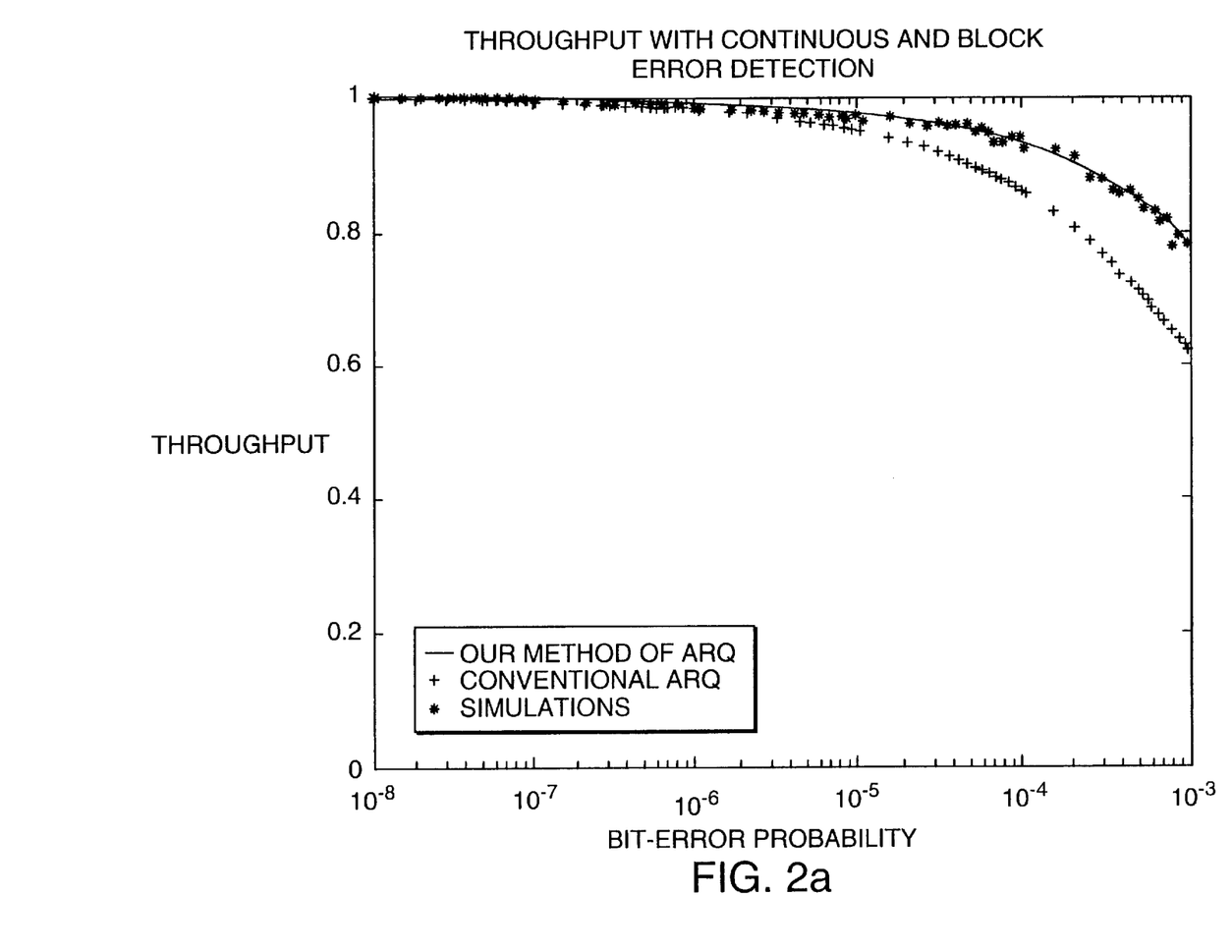
FIG. 2A illustrates throughput curves of the new inventive method of ARQ as compared with conventional ARQ at various bit-error probabilities.

FIG. 2A illustrates throughput curves of the present inventive method of ARQ as compounded with conventional ARQ at different values of bit error probabilities.

Simulations were run using a binary symmetric channel (BSC) at various bit-error probabilities with multisymbol data alphabets. Several 10 kbit packets were sent at each bit-error probability, and the resulting throughput was calculated. As a measure of performance, applicants compared the inventive method of ARQ to conventional methods of ARQ. The conventional methods of ARQ function by dividing the data into packets and then attaching block CRC to each packet; upon detection of an error in the conventional ARQ method, a retransmission of the entire block is requested. To simulate a fair comparison for applicants' method versus conventional ARQ methods, the optimal packet size was used at each of the bit-error probabilities tested using conventional ARQ. Accordingly, the optimal $\epsilon$ was also found, and used for each of the bit-error probabilities tested using applicant's new method of ARQ. The resulting throughputs are shown in FIG. 2A. From the figure, it is seen that the new method of ARQ outperforms conventional ARQ methods at all bit-error probabilities. The optimal packet size for conventional ARQ methods is found by solving for the packet size which maximizes the throughput. Throughputs for bit-error probabilities greater than $10^{-3}$ are not shown in the figure, because ARQ is no longer practical at such high-bit error probabilities. Furthermore, applicants' new method of ARQ is well-suited for time-varying channels, because $\epsilon$ can be continuously adapted as a function of the channel conditions.

Figure 2B:
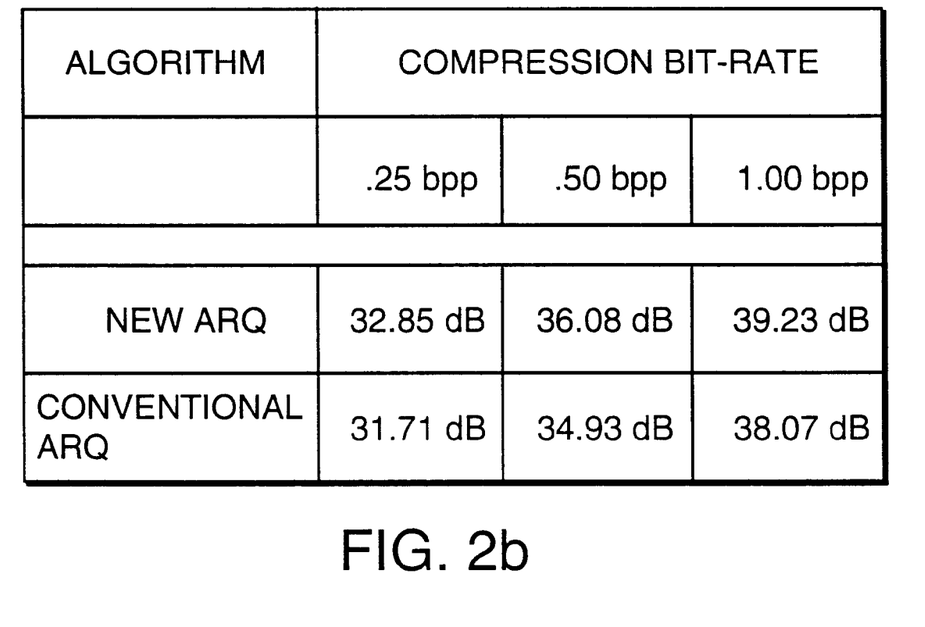

Applicants' new method of ARQ is especially useful for image transmission. Currently, arithmetic coding is the entropy coder of choice in popular image-compression systems as understood in the context of the publication "Image Comparison using the Spatial Orientation Tree", by A. Said and W. Pearlmann in *Int. Symp. Circuits and Systems,* vol. 1, Chicago, pp. 279–289, May 1993. Hence, using the new method of error control, only one "device" is needed to do both source compression and channel coding for noise suppression for image-transmission systems when ARQ is used. As an example, applicants ran some simulations using the coder of A. Said and W. Pearlmann in conjunction with the present inventive method of ARQ. A 512×512 image of a picture was coded using both the present inventive method and the conventional method of ARQ at a bit-error probability of $p_b=10^{-3}$. Again, the optimal $\epsilon$ was used for the applicants' method, and the optimal block size N was used for the conventional ARQ method. To measure the performance of each method, applicants fixed the total delay, which translated into fixing the total number of bits that were allowed for transmissions and retransmissions. When the total number of bits allowed were exhausted, the peak signal to noise ratio (PSNR), using each method, was measured. The table in FIG. 2(B) presents the PSNR values for different constraints using both the applicants' method and the conventional method of ARQ. As can be seen from the table, significant PSNR gains were achieved by applicants' method of ARQ over the conventional method of ARQ.

Application of Continuous Error Detection to Decoding of Convolutional Codes

Figure 3A:
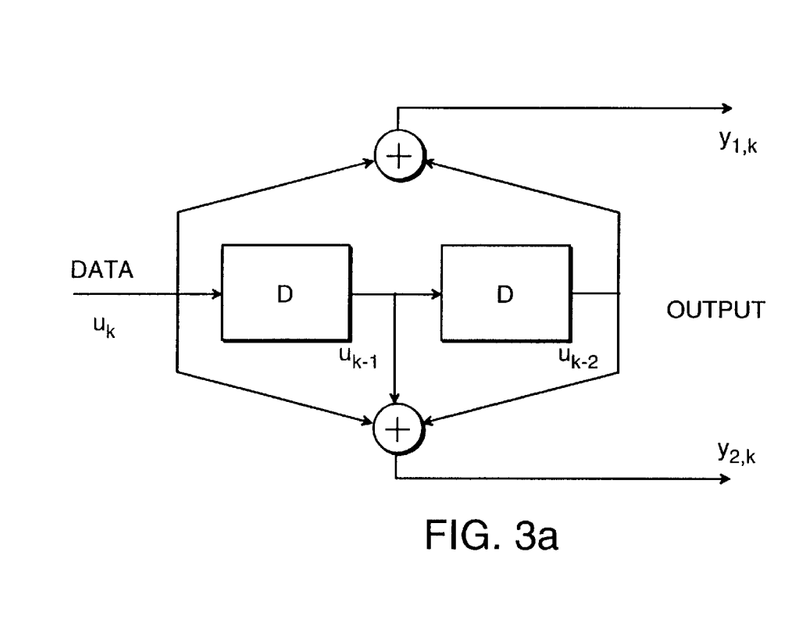
FIG. 3A shows an example of a binary convolutional encoder.
Figure 3B:
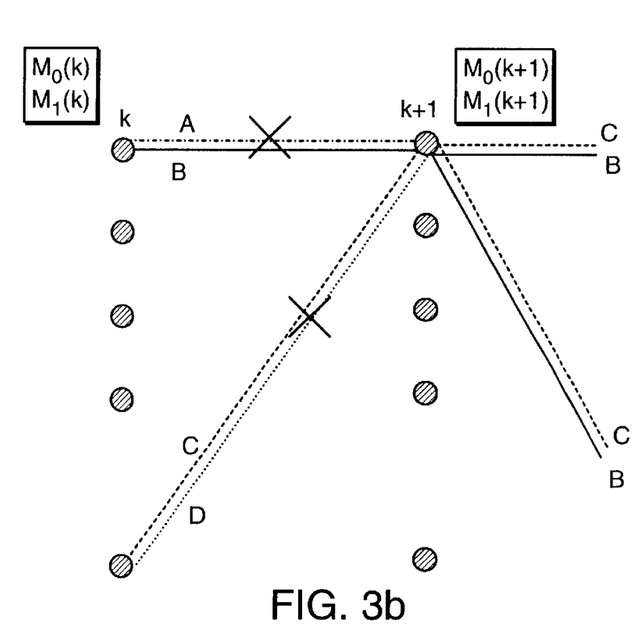
FIG. 3B is an illustration of the parallel list-VA (VA= Viterbi Algorithm) for N=2 paths in the list.

FIG. 3A illustrates an exemplary convolutional encoder; 3B is an illustration of the parallel list Viterbi Algorithm for N=2 paths in the list.

Concatenated coding schemes for forward error control are becoming extremely popular due to their high performance and the existence of efficient decoding algorithms. In this work, applicants consider serially concatenated coding schemes with an inner convolutional coder and an outer error detection coder. A convolutional encoder can be represented in the shift register form as shown in FIG. 3A. Since the memory is finite, the equivalent finite Markov chain and trellis representation are easily constructed (not shown). Suppose that the output of a convolutional encoder (such as the one in FIG. 3A) is transmitted over a memoryless channel. The receiver has to perform the maximum likelihood estimation of the transmitted data sequence $\{u_k\}$ using the received vector sequence $\{z_k\}$ which is the output of the memoryless channel with the input being $\{y_k\}$. The solution to this problem is given by the Viterbi Algorithm (VA), originally proposed in "Error Bounds for Convolutional Codes and an Asymptotically Optimal Decoding Algorithm" by A. Viterbi, in *IEEE Transaction of Informal Theory*, vol. IT-13, pp. 260–269, 1967, the contents of which are incorporated herein by reference. The VA searches for the shortest route through that trellis which represents the convolutional encoder with the edge weights from states at time k to states in time k+1 being dependent on the current channel output vector $Z_k$. Further details on the VA may be found in the paper by A. Viterbi.

The key observation is that despite the fact that the VA in its original form produces a best estimate of the transmitted codeword, this estimate may be incorrect. By using an additional error detecting channel code (typically CRC), it is possible to tell with a very high confidence level whether the survivor path is error free at the price of insignificant increases in the overall channel rate. By making appropriate modifications, the VA algorithm can be changed to output an ordered list of the "N-most likely" transmitted code words (for a list-N VA), i.e., instead of finding the best path, applicants require a list of N best paths, resulting in considerable improvements over the original VA. An example of such modification is called the "parallel" list VA in "List Viterbi Decoding Algorithms with Applications", by N. Seshadri and C. Sundberg, in *IEEE Transactions on Communications*, vol. 42, pp. 313–323, 1994, the contents of which are incorporated herein by reference. In the parallel list VA, at every step of the algorithm, the list of N best paths coming into each state is maintained rather than a single path as in the conventional VA. Those N survivor paths are checked (in the order determined by their accumulated metrics) at the end of the data block using an error detection code until the first valid path is found. The parallel list VA is illustrated in FIG. 3B for N=2. A more efficient "serial" implementation is also possible which stores all decisions along the trellis and allows for the request of additional path estimates only when needed. To summarize, the list VA algorithms allow to trade the complexity of the decoder for its performance. It is also true that most of the performance gain can be expected by maintaining a list of 3–5 paths instead of one, as referred to in "List Viterbi Decoding Algorithms with Applications", by N. Seshadri and C. Sundberg, in *IEEE Transactions on Communications*, vol. 42, pp. 313–323, 1994. Further increase in the size of the list gives rather insignificant gains.

The present proposed scheme uses the idea of producing a list of best path estimates similar to that in the Seshadri and Sundberg paper. However, the outer block error detection code (CRC) is replaced by a continuous error detection code. It is assumed that the total number of paths in the list N is fixed to address computational complexity/delay constraints, and a parallel version (which is well suited for hardware implementation) of the list VA (—note that for fixed N, both parallel serial and implementations have the same performance—) as shown in FIG. 3B is considered. The motivation is that if channel errors occur at the beginning of the block, there is a good chance that this will render all the paths in the list-N VA (for small N) incorrect, resulting in an undesirable "no correct path" situation. The proposed inventive continuous error detection allows to prune some incorrect paths earlier than the end of the block, and, thus, to increase the probability that the correct path will survive. A proposed inventive scheme is illustrated in FIG. 4.

Figure 4:
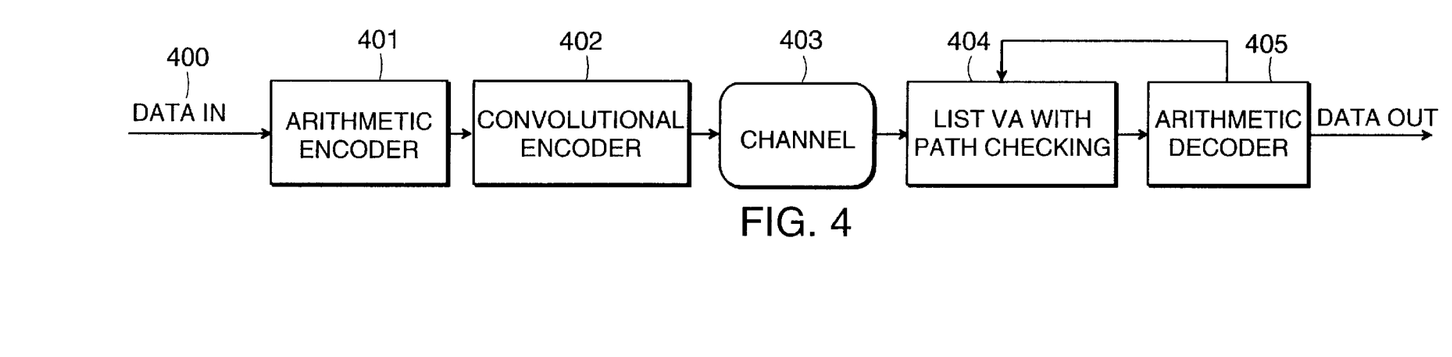
FIG. 4 illustrates how the list VA is handled with continuous error detection.

The illustration in FIG. 4 is the application of continuous error detection (CED) to the forward error detection (FEC) scheme. The preferred embodiment of a system using continuous error detection in FIG. 4 shows a feedback path from the list VA coder to the arithmetic decoder. The incoming data 400 is encoded with an arithmetic coder 401 with ε-redundancy to achieve continuous error detection which allows to detect errors if any occur. Next, the data is encoded with the convolutional FEC coder 402 and transmitted through the channel 403. The decoding is performed jointly by the list Viterbi algorithm (list VA)404, which maintains several most likely candidates by exploiting the redundancy of the convolutional code, and by the arithmetic decoder 405 which performs CED. Arithmetic decoder 405 is used to validate the candidate paths in the list VA decoder on-the-fly, which improves the over all performance. Note the presence of a feedback path from the arithmetic decoder 405 to the list VA decoder 404.

The system operates as follows (see FIG. 3B). At each state of the trellis, N best paths are chosen from among the incoming 2N paths (a binary alphabet, as shown in FIG. 3B, is assumed). The decision about the survivor paths is made based on both the accumulated metric and the validity of the path. In this case, if the arithmetic decoder signals an error event for a given path, this path is pruned and replaced by a "valid" path having the next best accumulated metric.

Results for Concatenated Coding with the List VA and Continuous Error Detection

To assess the performance of the proposed modified list VA decoder, applicants compare it to the list VA scheme as in the Seshadri, Sundberg publication, supra, in terms of the complexity/storage requirements for the same performance as well as in terms of signal-to-noise ratio (SNR) gain. In all experiments conducted by the inventors, the value of ε was set to be equal to $10_{-2}$, which resulted in approximately 1.5% increase in the data rate: this is accounted for by reducing the SNR appropriately in the comparisons. Inventors also chose to keep the packet structure with CRC for simulation purposes.

Complexity/Storage and SNR Performance

Figure 5A:
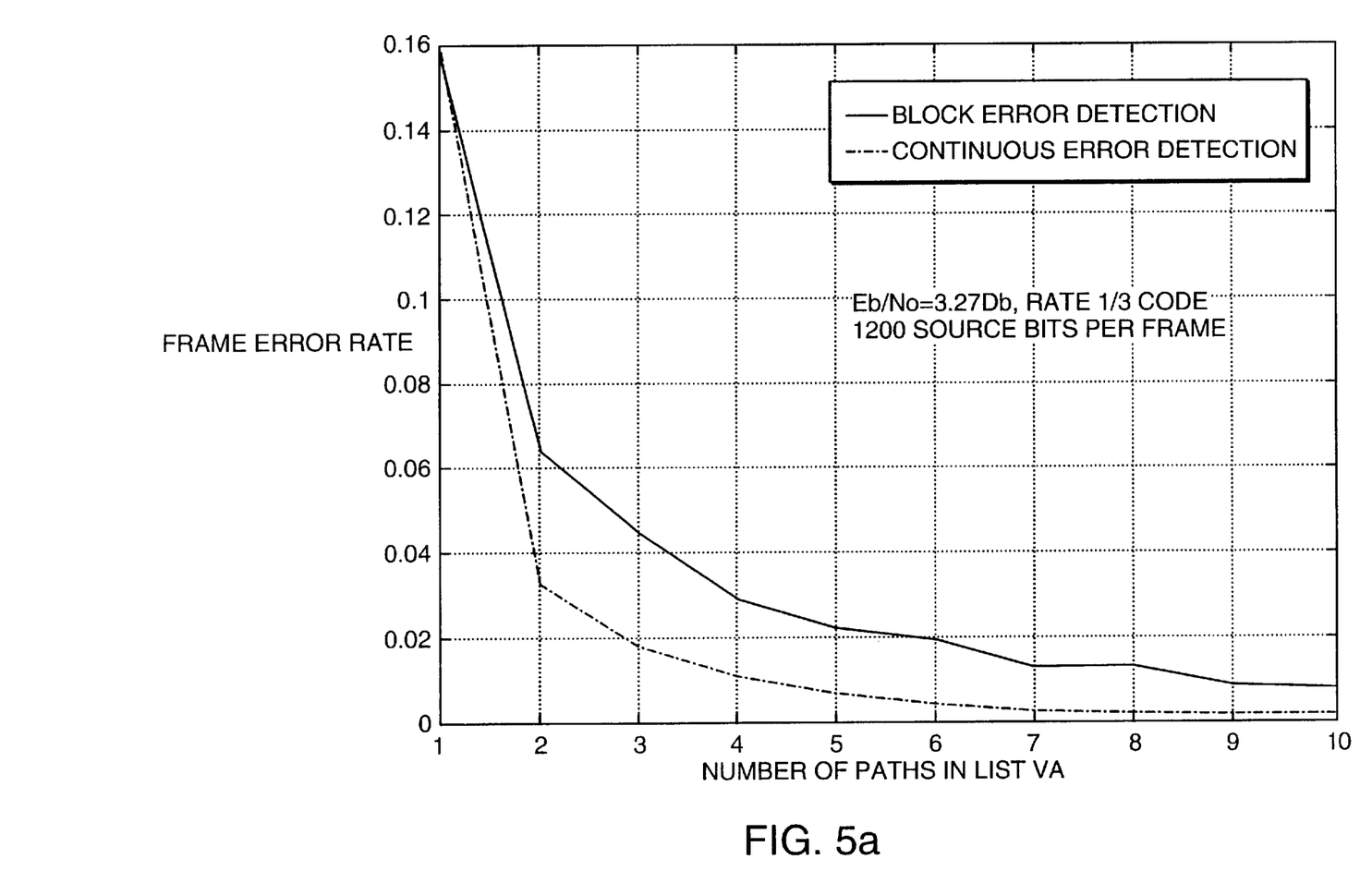
FIGS. 5A and 5B respectively show comparisons of frame error rate (FER) and bit error rate (BER) vs. the number of paths for the reference list VA and the list VA with continuous error detection.
Figure 5B:
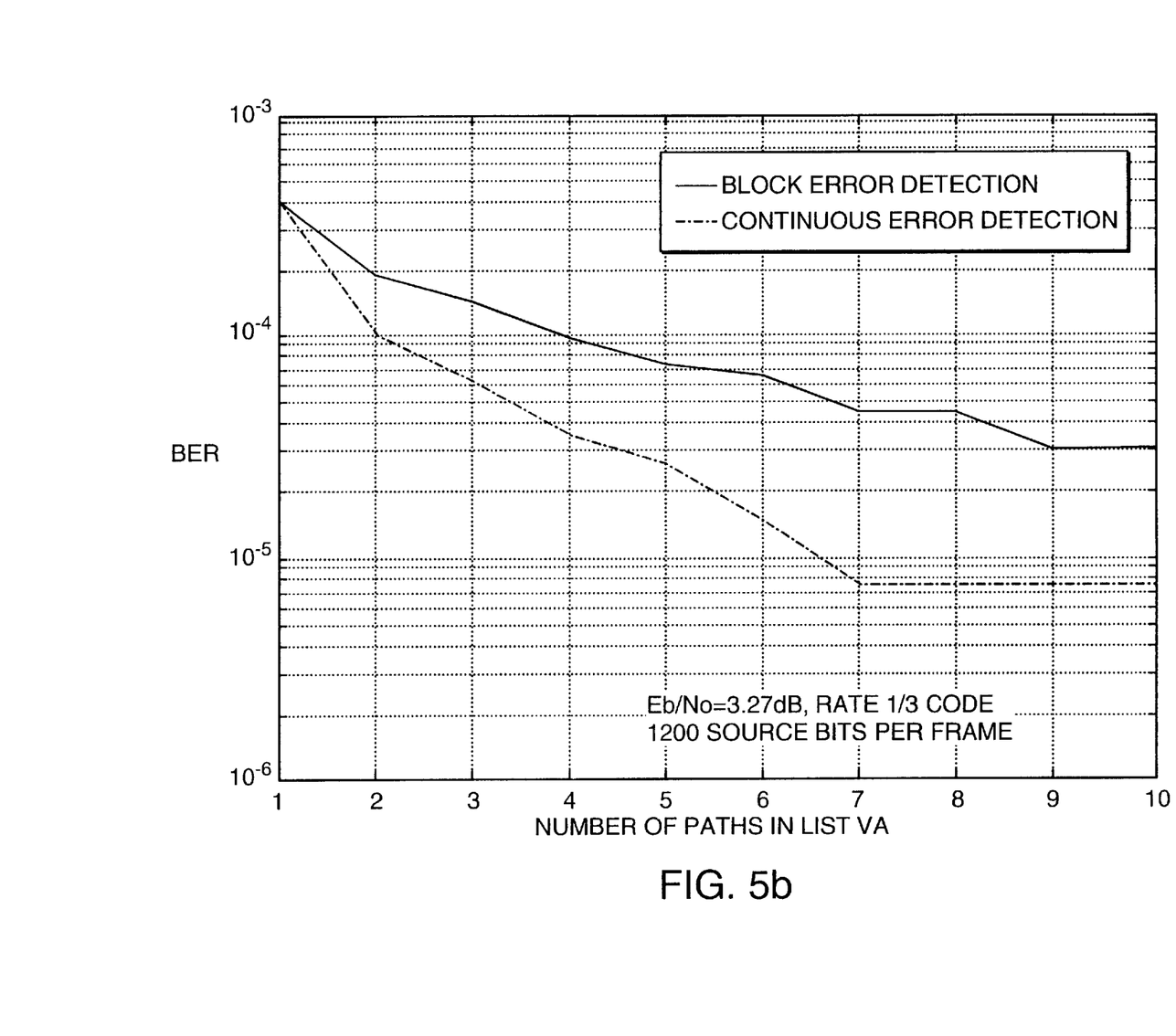

A comparison of the complexity/storage requirements of the list VA with block CRC and the list VA with continuous error detection for rate 1/3 memory 4 Rate Compatible Punctured Convolutional (RCPC) code is made for the same frame and bit error rates with reference to the data in "Rate Compatible Punctured Convolutional (RCPC) Codes and Their Applications", by J. Hagenauer, in *IEEE Transaction Communications*, vol. 36, pp. 389–400, April 1988, the contents of which are incorporated herein by reference. The results are presented in FIG. 5. Note that the number of paths in the reference list VA has to be about two times higher than the number of paths in the proposed system for the same target performance. The storage requirements are significantly reduced in the proposed scheme since only a single register is needed to store the state of the arithmetic coder/ decoder for each path, while the number of maintained paths is significantly lower. Additional computational complexity of arithmetic coder does not depend on the size of the data and can be addressed by efficient implementations.

Figure 6A:
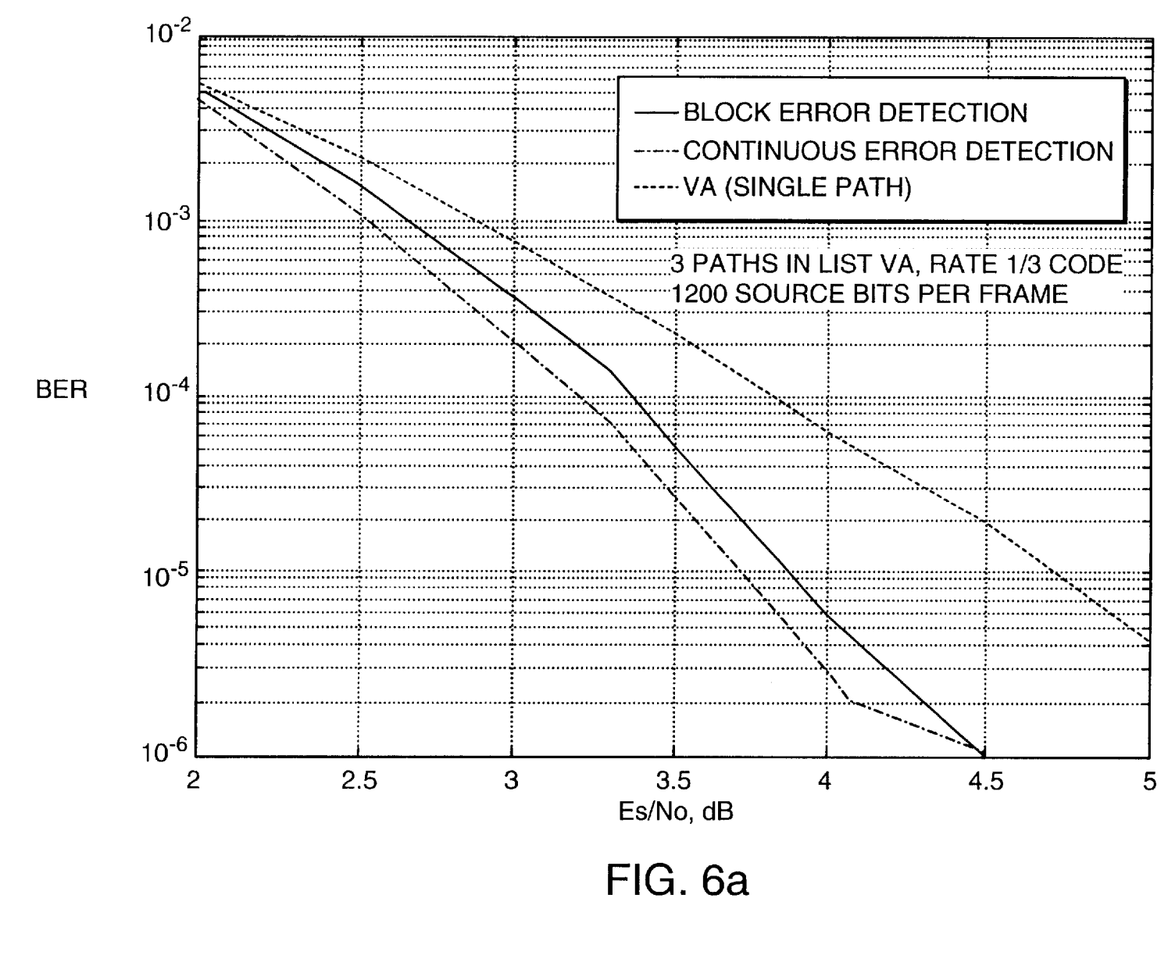
FIGS. 6A and 6B show comparison of bit error rate vs. signal-to-noise ratio, respectively, for rates 1/3 and 8/9 memory 4 coding for the reference list VA with N=1 and N=3, and list VA with N=3 and continuous error detection.
Figure 6B:
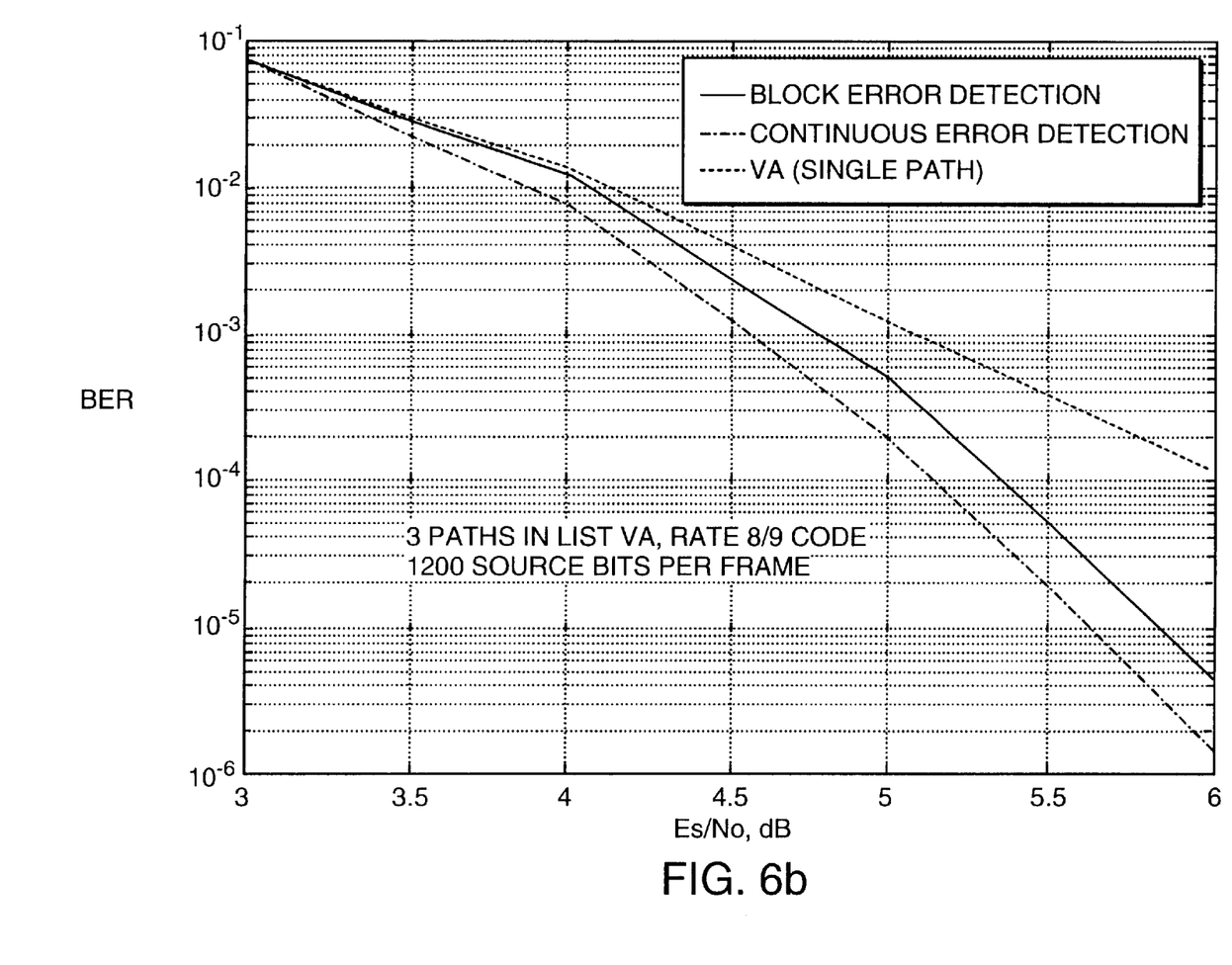

The proposed scheme also offers gains in channel signal-to-noise ratio (SNR) for a target bit error rate (BER) when compared to the list VA with block error detection, as illustrated in FIG. 6. The gains are up to 0.25 dB in channel SNR, certainly non-negligible considering that the present proposed method is only for error detection and not for error correction. For comparison purposes, the performance of the original VA (single path in the list) is also shown.

Image Transmission Experiment

The inventive proposed method of serial concatenation of a convolutional code with a continuous error detection code can be efficiently applied for image transmission when combined with a high performance state-of-the-art image coding scheme such as the wavelet based Estimation Quantization (EQ) coder discussed in "Image Coding Based on Mixture Modeling of Wavelet Coefficients and a Fast Estimation-Quantization Framework", by S. Lo Presto, K. Ramchandran and M. T. Orchard, in *Proc. IEEE Data Comparison Conf.*, 1997. Applicants carried out simulations for a binary symmetric channel with probability of bit error being equal to $10^{-2}$ and mimic the channel coder setup taught in "Progressive Image Coding on Noisy Channels", by P. G. Sherwood and K. Zeger, in *Proc. IEEE Data Comparison Conf.*, Snowbird, Utah, 1997. Memory 6 RCPC code of rate 8/12 is chosen with the list VA decoder maintaining 10 paths. The image data is packetized into blocks of 200 bits. For this setup, applicants found that the packet loss rate for the proposed scheme with continuous error detection equals $2.2 \times 10^6$ (compared to $2.9 \times 10^{-6}$ for CRC-based detection). Given this channel coder performance, the reconstructed image distortion (the Lena image was used) is lower bounded (assuming that the image is lost if a single packet is in error) as 32.14 dB PSNR (peak signal to noise ratio). For comparison, this is approximately 0.15 dB better than the best result known in the literature, for example, Sherwood and Zeger, supra. Note that this gain comes from both a more efficient source coder and a better channel coder, but it is largely due to the first factor as the packet loss rate is rather insignificant. No optimization was done in this experiment. By adjusting the parameters appropriately, higher gains can be expected.

Figure 7:
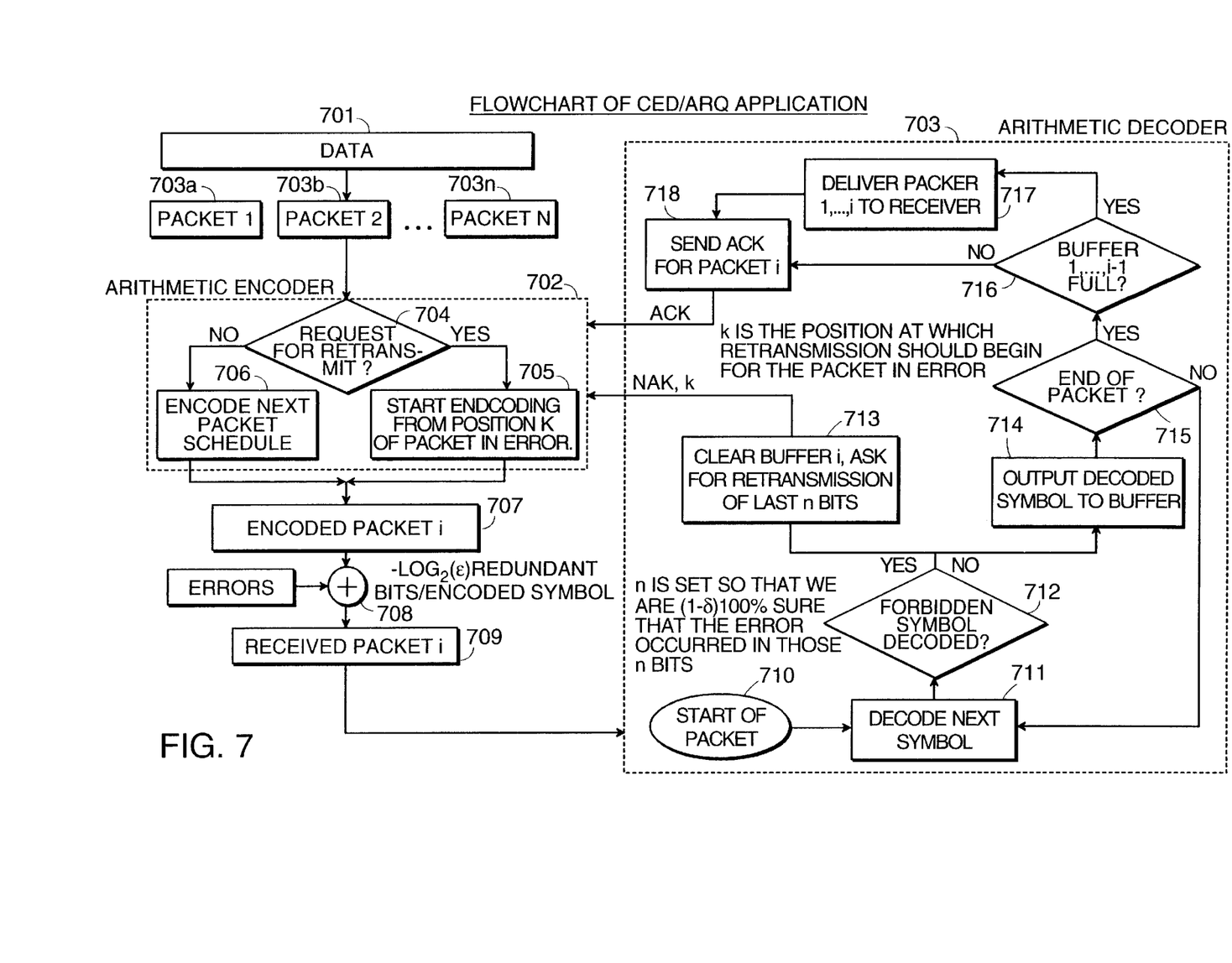
FIG. 7 is a process flow chart illustrating a process for encoding and decoding data using ARQ to provide continuous error detection, according to an embodiment of the invention.

With specific reference to FIG. 7, illustrated is a process for encoding and decoding data using the principles of the present invention. More specifically, FIG. 7 is a flowchart of image transmission using arithmetic coding, based on continuous error detection using an automatic repeat request (ARQ) application.

Data 701 which may be in the form of a plurality of packets, e.g., packets 1, 2, 3, identified as 703a, 703b, and 703n are encoded in an arithmetic encoder 702. As explained earlier, in ARQ applications, if there is an error, there is an associated request for retransmitting as at 704. If there is no specific request for retransmission, a given packet is encoded, and a next scheduled packet is subsequently encoded. This operation may continue until all packets are encoded. For the sake of illustration, an encoded information packet (i) is shown at 708, which has added errors and injected redundant bits. The received packet shown at 709 thus includes errors and certain redundant bits which are not meant to be encoded.

An exemplary arithmetic decoder is shown at 703 in the context of a continuous error detection ARQ application. The start of packet for purposes of decoding is shown at 710. At 711, the next packet gets decoded and is identified as "decode next symbol". Next, the process checks to see if a forbidden symbol is decoded. If negative, the output from the decoded symbol is sent to buffer "I". If, on the other hand, a forbidden symbol was indeed decoded, the system clears the buffer "I" and asks for retransmission of the last "n" bits in which the error seems to have occurred, as shown at 713.

Additionally, "n" is set so that there is $(1-\delta) \times 100\%$ surity that the error occurred in the "n" bits under question. In the alternative, after the step 714, the process as illustrated finds out if the end of packet is reached, as shown at 715. If affirmative, the process finds out at 716 if buffer "I" is full. If negative, a reiteration through step 711 is initiated. Beyond step 715, if the process finds out, as shown at 716, whether a certain buffer, i.e., a buffer from the group 1 through I is full. If negative, an acknowledgment for packet I is sent to the arithmetic encoder as shown at step 718. If affirmative, the process completes the step of delivering packet 1 through I to receiver as shown at 717, which, in turn, provides an output to the acknowledgment box at step 718.

The Functionality of the Flow Chart: Transmitter

Data is partitioned into packets 703a, b, ..., n, which are each arithmetically coded. The packets are transmitted after they are encoded, along with header information that will specify the packet number and synchronization information. The above is exactly as in regular selective repeat ARQ. Where it differs is that when a retransmit request is received, the transmitter does not retransmit the entire packet that is in error, but rather from the location in the packet specified by the receiver. For example, if a packet consists of the data "abcdefghij", then in typical schemes, a retransmit entails the retransmission of the entire packet "abcdefghij". In this case, the system would start retransmitting from a point specified by the receiver, e.g., "defghij".

The Functionality of the Flow Chart: Receiver

The receiver receives at 710 the packets of information and does not sort the packets until successive packets are received error-free. For example, if the receiver has received packets 1, 3, and 4 error-free, but packet 2 is in error, then the buffer can not deliver packets 3 and 4 until packet 2 is successively received. The receiver will continuously decode each received packet until one of two things happen:

(1) an error symbol is decoded as at 712; or (2) the entire packet is received without decoding an error.

In case (2), the packet will be placed in a buffer, and the buffer will decide if the packet can be delivered to the user (i.e., there are no packets prior to the current packet that are still being decoded). In case (1), a retransmit request will be initiated, and the location in the packet within which the error is believed to be contained will be transmitted to the transmitter. Retransmissions will be requested until the entire packet is received error-free.

To Summarize, Automatic ReQuest (ARQ) protocols are known to be used in data and image communications. The ARQ protocols generally function by parsing data into blocks that are screened for transmission errors. Current ARQ protocols use Cyclic Redundancy Checks (CRC) to detect errors. In this invention, a new method of error detection is introduced which is achieve by embedding small amounts of controllable redundancy in an arithmetic encoder and then using the arithmetic encoder to encode the data. By adding a "forbidden" symbol to the list of data symbols, then when an error occurs, the "forbidden" symbol can be guaranteed to be decoded due to loss of synchronization. This method can also be used to control the number of bits that seem to require retransmission. Upon applying this method to selective-repeat ARQ, gains in throughput can be made over conventional ARQ schemes at all bit error probabilities.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. It is conceivable that with reference to FIG. 7, the means per se for encoding and decoding data, the structure and type of the buffer and the means and manner of retransmission of data can all be replaced with functional equivalents. Likewise, with reference to FIG. 4, the arithmetic encoder, the convolutional encoder, and the arithmetic decoder can be replaced with functional equivalents which are known to those skilled in the art. Likewise, "data" transmission in this invention is to be construed to mean all data including images, information codes, digits, analog and digital signals which are transmissible, without exception. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A method of data-transmission from a transmitter to a receiver in data packets using an arithmetic coder without using cyclic redundancy check codes, comprising:

adding a forbidden symbol, which occupies $\epsilon$-th portion of a coding space to a data stream of said data to increase redundancy, said forbidden symbol not being meant to be coded;

controlling said coding space as necessary to control the redundancy;

tracking to see if said forbidden symbol is decoded at the receiver and using a presence of such decoded forbidden symbol for error detection in said data transmission;

conveying a location of an error to the transmitter; and requesting a retransmission of n bits in a data packet after the error location where n is related to a confidence level, whereby continuous error detection in said data transmission is performed with automatic repeat request.

2. A method as in claim 1 where the step of requesting a retransmission comprises sending an overhead of $R_n$ bits over a feedback channel, where $R_n$=$\log_2(N)$+a predetermined integral number, where N= a packet size of data transmitted which needs no optimizing.

3. A method as in claim 1 including the step of ascertaining said coding space which said forbidden symbol occupies, and therefrom making a statistical determination of a location during data-transmission where an error might have occurred, thus assisting in conveying the position of an error to the transmitter.

4. A method as in claim 1 including the step of controlling said coding space to generate a desired speed to identify a location of error.

5. A method as in claim 1, wherein, if Y represents the number of bits it takes to detect an error after an error occurs, and if a character $\delta$=P[y>n], said step of requesting a retransmission of 'n' bits is governed by the relationship $$n = \frac{\log_2(\delta)}{\log_2(1-\epsilon)},$$

wherein further, said confidence level is represented by (1-$\delta$) where the confidence level is the probability that the detected error occurred in the previous 'n' bits.

6. Apparatus for data transmission using automatic repeat request to obtain continuous error detection, comprising:

means to partition data into packets and introduce a forbidden symbol which is not intended to be transmitted;

an arithmetic encoder to encode the data in packets and transmit them;

means to decode data received at a receiver;

means to identify an error within a packet during transmission based on whether a forbidden symbol is decoded; and means to request retransfer of only a portion of the packet with the error, which portion occurs after a location of the error, whereby a need to retransmit an entire data packet wherein an error has occurred is obviated.

7. A method of transmitting data from a transmitter to a receiver using an automatic repeat request (ARQ) to obtain continuous error detection, comprising the steps of:

partitioning the data into packets and introducing into process of encoding the partitioned data a forbidden symbol which is not intended to be normally transmitted, nor decoded at the receiver, receiving the transmitted data and checking to see if a decoded version of the forbidden symbol exists, indicating a transmission error;

deciding in which data packet said transmission error occurred; and initiating retransmission of a portion of the data packet where said error occurred, said portion being located after occurrence of the error whereby data transmission is rendered more efficient.

8. In image and data communications, of the type using automatic repeat request (ARQ) protocols wherein data is parsed into data blocks for transmission and wherein those blocks which are deemed to contain errors are required to be retransmitted, an improved method for error detection comprising:

using arithmetic coding for coding data, and introducing into the data, a forbidden symbol which is never encoded, said forbidden symbol occupying a controllable amount of coding space;

using an existing arithmetic coder, if any, for both entropy coding and continuous error detection;

ascertaining, if said forbidden symbol is decoded; and controlling a time interval from when an error occurs to when aforbidden symbol is decoded, said controlling being effected by manipulating said coding space which said forbidden symbol occupies, thus controlling a number of bits which need to be retransmitted, whereby error detection is continually done without having to retransmit entire data blocks in which an error is detected, and only that portion of a data block which occurs after an error location needs to be retransmitted.

* * * * *